United States Patent
Ishiu

Patent Number: 6,020,225
Date of Patent: Feb. 1, 2000

[54] METHOD OF MANUFACTURING ARRAY SUBSTRATE OF A LIQUID CRYSTAL DISPLAY DEVICE

[75] Inventor: Takehiko Ishiu, Fukaya, Japan

[73] Assignee: Kabushiki Kaisha Toshiba, Kawasaki, Japan

[21] Appl. No.: 08/919,330

[22] Filed: Aug. 28, 1997

[30] Foreign Application Priority Data

Aug. 30, 1996 [JP] Japan ................................. 8-230152

[51] Int. Cl.$^7$ ................................................. H01L 21/336
[52] U.S. Cl. ................ 438/166; 438/151; 65/32.1; 65/111; 65/117
[58] Field of Search ................ 65/32.1, 111, 117; 438/149, 151, 166

[56] References Cited

U.S. PATENT DOCUMENTS 5,663,077  9/1997  Adachi et al. .
5,674,304  10/1997  Fukuda et al. .

FOREIGN PATENT DOCUMENTS 3-57613  3/1991  Japan .

*Primary Examiner*—Chandra Chaudhari
*Assistant Examiner*—Keith Christianson
*Attorney, Agent, or Firm*—Pillsbury Madison & Sutro LLP

[57] ABSTRACT

A method of manufacturing an array substrate of a liquid crystal display device where the array substrate comprises a glass substrate and a thin film transistor formed on the glass substrate, the method comprising the steps of, heat-treating the glass substrate at a temperature ranging from (Ts−200° C.) to Ts (Ts: a strain point of glass constituting the glass substrate), and quenching the glass substrate by quenching means which is capable of promoting a cooling of the glass substrate and controlling the cooling rate of the glass substrate.

10 Claims, 3 Drawing Sheets

METHOD OF MANUFACTURING ARRAY SUBSTRATE OF A LIQUID CRYSTAL DISPLAY DEVICE

BACKGROUND OF THE INVENTION

This invention relates to a method for manufacturing an array substrate; and in particular to a method for manufacturing an array substrate of an active matrix type liquid crystal display device where a switching device formed of a thin film transistor (TFT) is employed.

Since a liquid crystal display device has prominent advantages in the aspects that it is not bulky, is light in weight and is low in power consumption, it has been extensively utilized in a display device of office automation (OA) apparatus such as a word processor and a disk-top type personal computer in recent years. In conformity with this trend, the development of liquid crystal display device employing a thin film transistor or a thin film transistor array where a polycrystalline silicon is employed as a material constituting an active layer is actively undertaken with a view to improve the performance of the display device.

A thin film transistor where polycrystalline silicon is employed for an active layer (i.e. a polycrystalline silicon thin film transistor) has been conventionally employed in a switching device of pixel portion constituting a display portion of liquid crystal display device, or in a driving circuit of a pixel switching device. Namely, the polycrystalline silicon thin film transistor is utilized as a pixel thin film transistor for applying a voltage to a liquid crystal device, or as a driving circuit thin film transistor for driving this pixel thin film transistor.

However, since this polycrystalline silicon thin film transistor was subjected to a heat-treatment of as high as 800 to 1100° C. in the manufacturing process thereof, a substrate made of a heat resistive material such as quartz was required to be employed for this polycrystalline silicon thin film transistor.

However, owing to the recent advancement in processing technique, the processing temperature of the polycrystalline silicon thin film transistor is now lowered so that it has become possible to form the polycrystalline silicon thin film transistor on an insulating glass substrate. However, as compared with the conventional manufacturing process of a transistor formed of amorphous silicon, a higher processing temperature is still required in the heat treatment of the polycrystalline silicon thin film transistor.

For example, a temperature of about 400 to 600° C. is still required in a dehydrogenation heat treatment as a pre treatment to obtain a polycrystalline silicon using a laser, in a heat treatment for stabilizing the interfacial characteristic between a gate oxide film and a polycrystalline silicon film, or in a heat treatment for lowering the resistance of source/drain.

The properties of polysilicon thin film transistor is much influenced by the conditions of these heat treatments.

When an insulating glass substrate is heat-treated at a temperature of about 400 to 600° C., the glass is shrunk thereby giving rise to the problem of deviation in pattern during the PEP process. For example, it has been found according to experiments made by the present inventors that when an insulating glass substrate (for example, NA35, a trade name of NH Techno Co. or #1737, a trade name of Corning Co.) is heat-treated at a temperature of 600° C. for 5 hours and then left stand to cool, a shrinkage of about 11 ppm was admitted.

If a shrinkage of substrate is generated to such an extent, a deviation will be generated between the central portion and the peripheral portion of the substrate after the heat-treatment thereof.

BRIEF SUMMARY OF THE INVENTION

Therefore, an object of this invention is to provide a method of manufacturing an array substrate, which enables to suppress the shrinkage of an insulating glass substrate in the processing of a thin film transistor, thus making it possible to manufacture a liquid crystal display device which is capable of displaying an image of high quality.

Namely, according to the present invention, there is provided a method of manufacturing an array substrate of a liquid crystal display device where the array substrate comprises a glass substrate and a thin film transistor formed on the glass substrate, the method comprising the steps of;

heat-treating the glass substrate at a temperature ranging from (Ts−200° C.) to Ts (Ts: a strain point of glass constituting the glass substrate); and quenching the glass substrate by quenching means which is capable of promoting a cooling of the glass substrate and controlling the cooling rate of the glass substrate.

Additional object and advantages of the invention will be set forth in the description which follows, and in part will be obvious from the description, or may be learned by practice of the invention. The object and advantages of the invention may be realized and obtained by means of the instrumentalities and combinations particularly pointed out in the appended claims.

BRIEF DESCRIPTION OF THE SEVERAL VIEWS OF THE DRAWING

The accompanying drawings, which are incorporated in and constitute a part of the specification, illustrate presently preferred embodiments of the invention, and together with the general description given above and the detailed description of the preferred embodiments given below, serve to explain the principles of the invention.

DETAILED DESCRIPTION OF THE INVENTION

The process for forming a thin film transistor useful for switching where polycrystalline silicon is employed as an active layer in a liquid crystal display device requires various heat treatments. Followings are examples of some of such heat treatments.

1. Heat treatment which is performed for stabilizing the interfacial characteristic between a gate oxide film and a polycrystalline silicon film after the formation of the gate oxide film.

2. Heat treatment which is performed for activating the impurities for the formation of source/drain.

3. Heat treatment which is performed for the dehydrogenation that is undertaken prior to an irradiation of energy beam to amorphous silicon layer containing hydrogen to turn it into polycrystalline silicon.

4. Heat treatment which is performed for converting amorphous silicon layer into polycrystalline silicon.

These heat treatments are required to be performed at a temperature of about 500° C. or more. For example, when a gate oxide film is heat-treated at such a high temperature in subsequent to the formation of the gate oxide film, the density of surface state at an interface between a gate oxide film and a polycrystalline silicon film will be lowered, thereby making it possible to improve the performance of the switching device.

The present inventor have made an experiment to measure the magnitude of shrinkage of glass substrates as follows. Namely, two kinds of glass substrate, i.e. Glass A (NA35, NH Techno Co.) having a strain point of 650° C. and Glass B (#1737, Corning Co.) having a strain point of 667° C. were heat-treated at various temperatures, and then left stand to cool in a furnace. As a result, the results shown in FIG. 1 were obtained.

Figure 1:
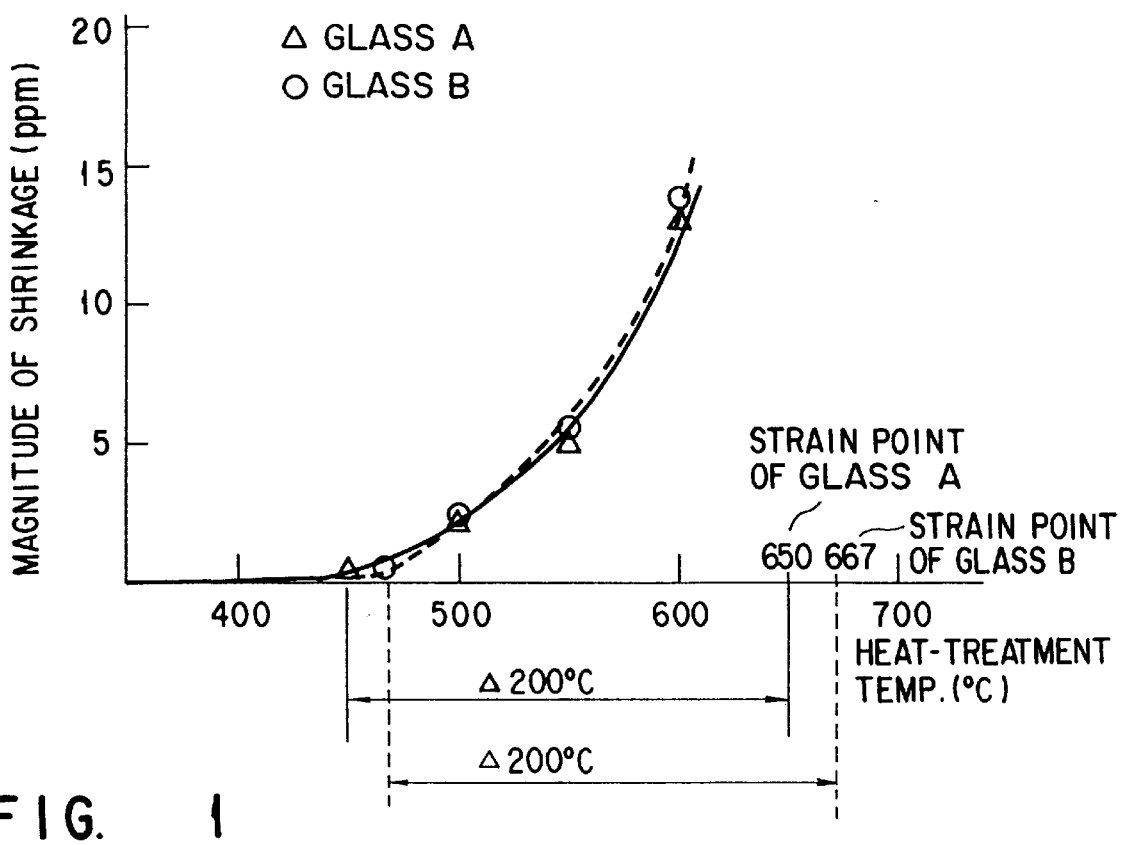
FIG. 1 is a graph illustrating a magnitude of shrinkage of a glass substrate when the glass substrate is heat-treated at various temperatures and then allowed to cool gradually in a furnace.

As seen from the results shown in FIG. 1, when the heat treatment was performed at a temperature higher than (Ts–200° C.), the magnitude of shrinkage became larger. Namely, the magnitude of shrinkage was increased when the heat treatment was performed at a temperature of about 450° C. or more in the case of Glass A, and at a temperature of about 467° C. or more in the case of Glass B. By the way, since the heat treatment of the glass substrate would not be performed at a temperature over the strain point in general, the upper limit of the heat treatment temperature is the strain point of the glass.

It has been found by the present inventor that when a glass substrate was forcibly cooled by a suitable cooling means rather than simply left stand to cool in a furnace after the glass substrate was heat-treated at a temperature falling within the aforementioned range, the magnitude of shrinkage can be suppressed.

It should be noted that the expression of "cooling means" set forth in this specification is intended to mean any suitable means which is capable of intentionally controlling the cooling rate and hence capable of quenching the glass substrate, rather than the glass substrate is simply allowed to left and cool gradually in a furnace. The expression of "simply allowed to left and cool gradually in a furnace" means a treatment wherein the power source of heat treatment is turned off and any forcible cooling is not undertaken at all. Therefore, even if a glass substrate is allowed to stand in a furnace, if any forcible cooling is undertaken in the furnace, such a process would fall within the definition of the "cooling means" according to this invention. For example, this cooling means may be a cooling process wherein a glass substrate in a furnace is quenched by introducing a cooling gas into the furnace; a cooling process wherein a cooling fluid or gas is blown to the outer wall of a furnace or a cooling fluid or gas is introduced into a space in a double framed wall of a furnace thereby heating the furnace so as to indirectly quenching a glass substrate in the furnace; or a cooling process wherein a plurality of furnaces or chambers, each being kept at a different temperature, are arranged and a glass substrate is sequentially transferred from one furnace or chamber to another.

The cooling rate by these cooling means may preferably be −4° C./min. to −10° C./min., more preferably −6° C./min.
to −8° C./min. If this cooling rate is lower than this lower limit, it may be difficult to exert the effect of suppressing the shrinkage of glass substrate according to this invention. On the other hand, if the cooling rate is higher than −10° C./min., the glass substrate may be badly cracked.

Since the glass substrate which has been deposited with a metal film would exhibit a larger shrinkage, the cooling rate thereof after heat treatment should preferably be increased as compared with the cooling rate to be performed on a glass substrate which has not been deposited with a metal film yet.

As explained above, according to this invention, the heat treatment of glass substrate is performed at a temperature ranging from (Ts−200° C.) to Ts, and then the cooling of the glass substrate is performed by a suitable cooling means. Therefore, the glass substrate is not given a sufficient time to shrink, thereby suppressing the shrinkage of the glass substrate. As a result, a deviation of a pattern on the glass substrate after a heat treatment from the original pattern before the heat treatment can be minimized, so that it is possible now to manufacture a liquid crystal display device which is capable of displaying an image of high quality.

This invention will be further explained with reference to the following examples shown in the drawings.

Figure 2:
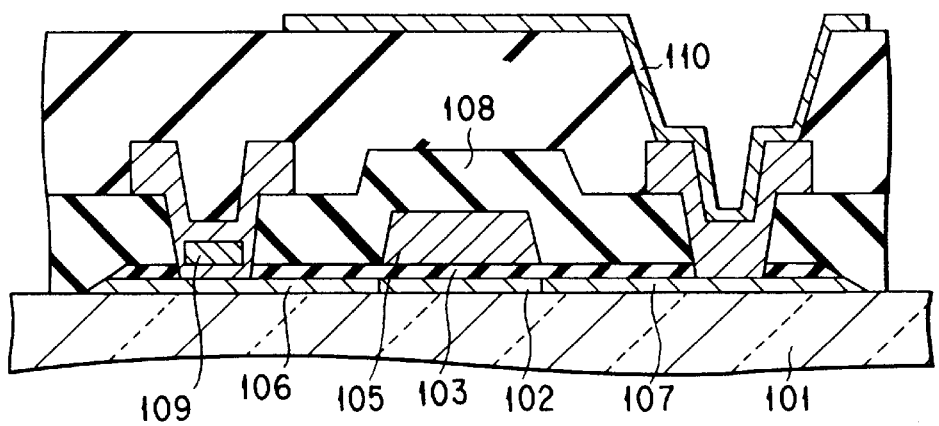
FIG. 2 is a cross-sectional view of a thin film transistor array substrate which has been manufactured by a method according to one example of this invention.
Figure 3:
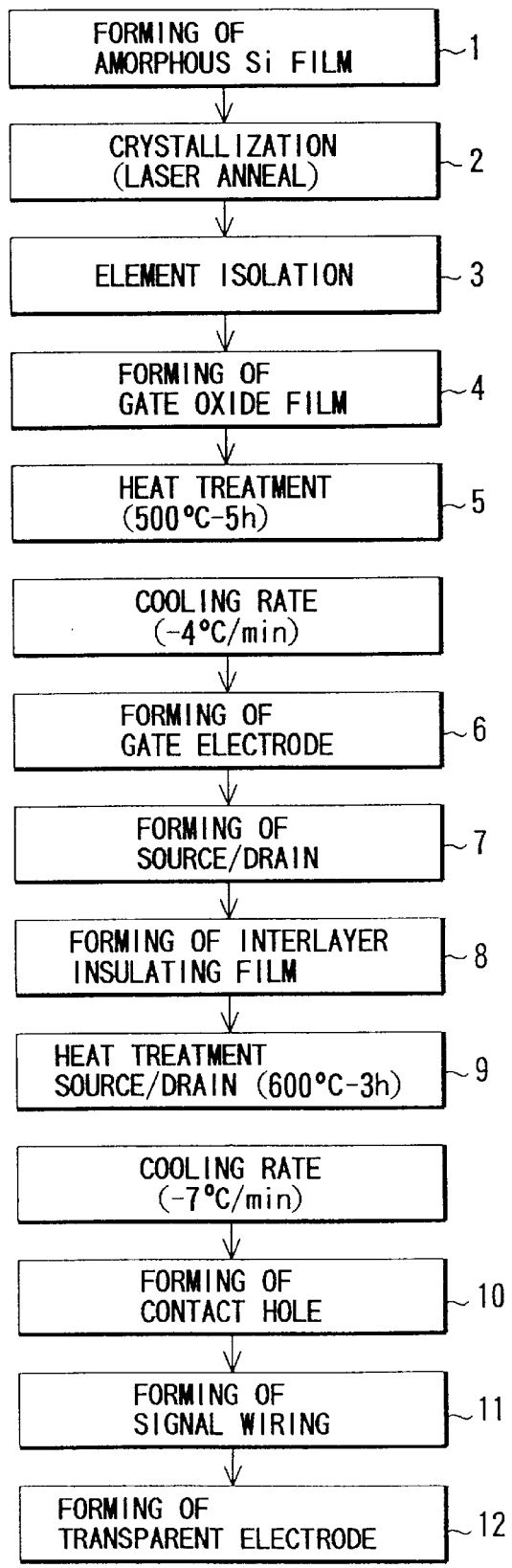
FIG. 3 is a flow chart illustrating the manufacturing process of a thin film transistor array substrate according to one example of this invention.

FIG. 2 shows a cross-sectional view of a thin film transistor array substrate which has been manufactured by a method according to one example of this invention, and FIG. 3 shows a flow chart explaining the manufacturing process of the thin film transistor array shown in FIG. 2.

Referring to FIGS. 2 and 3, an amorphous silicon film having a thickness of 50 nm to 100 nm is formed on an insulating substrate (e.g. an alkali-free glass or an alkali glass) 101 by means of plasma CVD. This amorphous glass may also be formed through a thermal decomposition of disilane using a low pressure CVD apparatus.

Then, the amorphous glass is allowed to anneal at a temperature of 500° C. for one hour thereby to remove hydrogen contained in the amorphous silicon film. This annealing step is performed for the purpose of preventing the ablation in the treatment of the amorphous silicon film with laser irradiation for crystallizing the amorphous silicon.

Then, the amorphous silicon film is irradiated with laser beam to crystallize the amorphous silicon film, thereby obtaining a polycrystalline silicon film 102. The polycrystalline silicon film 102 is subsequently subjected to a process of forming an element isolation of predetermined shape. Thereafter, a gate oxide film 103 is formed by means of an atmospheric pressure CVD method, and then heat-treated. In this case, the higher the temperature of heat treatment is, the smaller would be the density of surface state that may be generated between the polycrystalline silicon film 102 and the gate oxide film 103, thereby improving the reliability of the gate oxide film 103 (i.e. the magnitude of shift of property in the generally performed BTS test would become smaller). However, the deformation of glass substrate such as warpage and waviness would become more prominent. If the cooling of the glass substrate is performed by simply leaving the substrate in the furnace, the magnitude of shrinkage would become larger.

It has been confirmed by the present inventors that when the glass substrate is heat-treated at a temperature of 500° C. for 15 to 180 minutes, the density of surface states can be reduced from the value before the heat treatment (i.e. $4 \times 10^{11}$ ($cm^{-2}eV^{-1}$)) to $3 \times 10^{10}$ ($cm^{-2}eV^{-1}$), thus obtaining an excellent property. It has been also confirmed by the present inventors that when the cooling means described above is employed and the cooling rate is controlled to the range of −4 to −10 ° C./min., the shrinkage of the substrate 101 can be suppressed.

Then, a gate electrode 105 is formed on the gate oxide film 103. Thereafter, impurity (p-type or n-type) is ion-implanted into the polycrystalline silicon layer 102 by making use of the gate oxide film as a mask thereby to form a source 106 and a drain 107 in a self-alignment manner. Furthermore, an interlayer insulating film 108 is formed on the thin film transistor obtained by the aforementioned processes.

Then, the thin film transistor thus obtained is subjected to a heat treatment so as to lower the resistance of the source/drain portion. In this case, the higher the heat treatment temperature is, the lower the resistance becomes thus improving the property thereof. However, the magnitude of shrinkage of the glass substrate 101 would be concurrently increased. According to the conventional method, due to the generation of shrinkage of glass substrate by this heat treatment, the deviation of pattern is caused to generate so that the manufacture of an array substrate having a fine structure has been very difficult.

Whereas, the present inventor have succeeded in minimizing the shrinkage of glass substrate by quenching the glass substrate after this heat treatment. In the experiments, the heat treatment was performed at a temperature of 600° C. for 3 hours. The cooling of the substrate after the heat treatment was performed by accelerating the cooling rate as compared with the ordinary rate (−7° C./min.). As a result, the shrinkage of the glass substrate 102 was suppressed to about 1 ppm in contrast to the shrinkage of 8 to 9 ppm which was expected when the glass substrate 102 was left to stand in the furnace thereby cooling the glass substrate at a cooling rate of −2 to −3° C./min. As mentioned above, the cooling rate at this heat treatment should preferably be higher than that to be performed after the heat treatment of the gate oxide film 103.

Subsequently, a contact hole is formed at a predetermined portion of the interlayer insulating film 108, and then a metal wiring 109 is formed so as to obtain an ohmic contact with a contacting portion of the source 106 through the contact hole. Furthermore, a transparent electrode 110 is formed at the drain 107 and worked into a predetermined shape so as to be contacted with the drain 107.

The thin film transistor array manufactured in this manner is then arranged to face a counter electrode with a space being kept therebeween, and a liquid crystal is introduced into the space. Thereafter, the resultant composite is hermetically sealed to obtain a liquid crystal display device.

Figure 4:
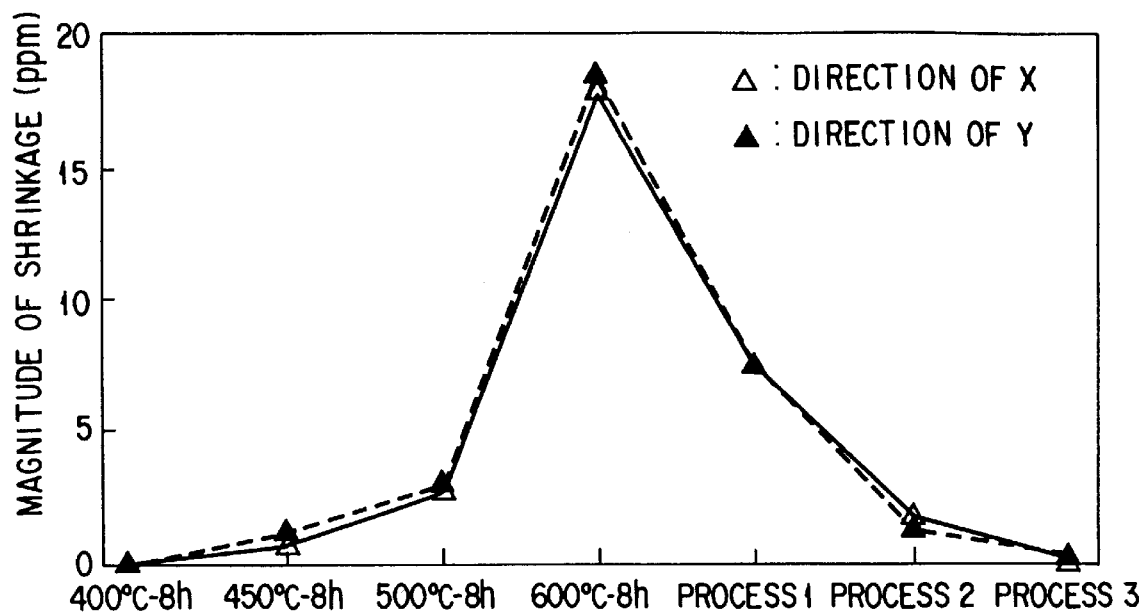
FIG. 4 is a graph illustrating a thermal shrinkage of a glass substrate after the heat treatment thereof.

In another experiment performed by the present inventors, a glass substrate (#1737, Corning Co.) (1.1 mm×300 mm×400 mm) was heat-treated and then cooled under various conditions to measure the shrinkage of the glass substrate. The results of this experiment are shown in FIG. 4.

The conditions in Process 1, Process 2 and Process 3 were as follows.

Process 1: heat treatment; 600° C./8 h; cooling rate: −3° C./min.

Process 2: heat treatment; 500° C./5 h; cooling rate: −7° C./min.

Process 3: heat treatment; 500° C./5 h+600° C./3 h; cooling rate: −7° C./min.

The cooling adopted in Process 1 was a slow cooling which was performed by leaving the glass substrate to stand in the furnace. Whereas, in the Process 2 and Process 3, the above-described cooling means was employed. The magnitude of shrinkage in the cases of the Process 2 and Process 3 was all not more than 5 ppm, and hence deemed to be within the allowable range.

It will be clear from FIG. 4 that according to the conventional cooling rate, the magnitude of shrinkage was increased depending on an increase in the heat treatment temperature, whereas in the case of this invention, the magnitude of shrinkage was decreased by performing a quenching after the heat treatment.

The specific heat at each temperature of the glass substrate (#1737, Corning Co.) employed in this experiment was as follows.

400° C.: 0.236 cal/g° C.

450° C.: 0.241 cal/g° C.

500° C.: 0.246 cal/g° C.

550° C.: 0.250 cal/g° C.

600° C.: 0.254 cal/g° C.

Figure 5:
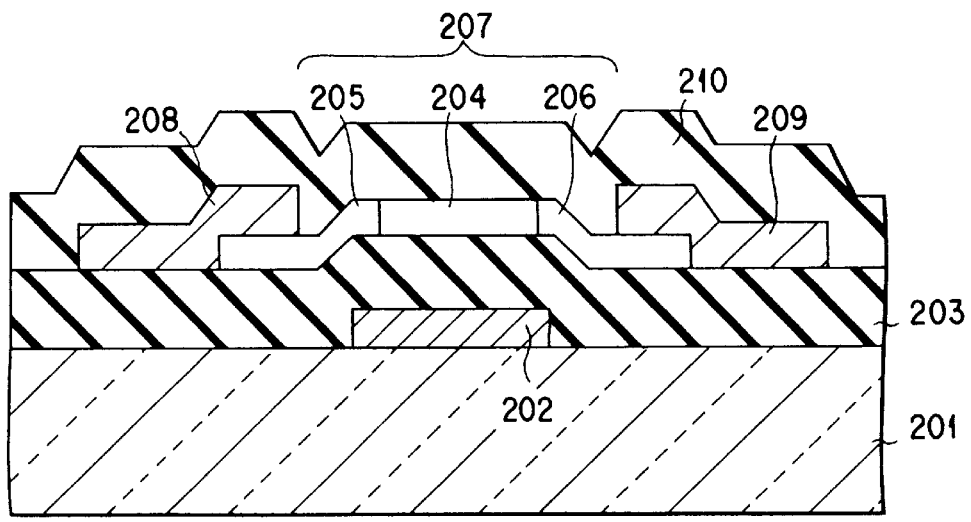
FIG. 5 is a cross-sectional view of a portion of a thin film transistor array substrate which has been manufactured by a method according to another example of this invention.

In the foregoing description, one embodiment where this invention was applied to the manufacture of a thin film transistor (TFT) of top gate type has been explained. Likewise, this invention is also applicable to the manufacture of a TFT of bottom gate type. This latter embodiment will be explained as follows in reference to FIG. 5.

The TFT of bottom gate type can be manufactured by the following steps.

First of all, a conductive film consisting of Mo, W, Cr or Al is deposited on a glass substrate 201 by means of sputtering, and then patterned by means of photolithography to form a gate electrode 202. Then, a silicon oxide film or a silicon nitride film is formed all over the surface of the glass substrate 201 by means of an atmospheric pressure CVD method or a plasma CVD method thereby to form a gate insulating film 203.

Then, amorphous silicon film is deposited on the gate insulating film 203 by means of plasma CVD. Thereafter, a resist layer is formed on a region of the amorphous silicon film where a channel region is to be subsequently formed. This resist layer is then employed as a doping mask, and the doping of P or B is performed to the source region or the drain region of the amorphous silicon film.

Subsequently, the doping mask is removed from the glass substrate, which was then heat-treated at a temperature of 500° C. for 1 to 1.5 hours in vacuo or in an inert gas (such as nitrogen gas) atmosphere. Then, the glass substrate is quenched in the same manner as explained above. Consequently, it is possible to suppress the shrinkage of the glass substrate.

Then, the amorphous silicon film is irradiated with laser beam to convert the amorphous silicon film into a polycrystalline silicon film. At this moment, the impurities doped in the source region and the drain region are concurrently activated. Thereafter, the polycrystalline silicon film is patterned to obtain a semiconductor layer 207 comprising a channel region 204, a source region 205 and a drain region 206.

Then, a conductive film consisting of Al for instance is formed all over the top surface of the glass substrate, and patterned by means of photolithography. Thereafter, a source electrode 208 and a drain electrode 209 are formed so as to be connected respectively with the source region 205 and drain region 206. Finally, an interlayer insulating film 210 is formed on the thin film transistor thus manufactured, thereby obtaining an array substrate shown in FIG. 5.

In any of the TFTs of top gate type or bottom gate type, the polycrystallizing step can be performed, in place of the aforementioned optical annealing method employing laser beam, etc., by means of a solid phase growth method wherein a heat treatment at a temperature of about 600° C. or more is employed. Even in this method, it is possible to suppress the shrinkage of glass substrate by performing a quenching the glass substrate by a cooling means according to this invention.

As explained above, since a quenching of glass substrate is performed by a predetermined cooling means after the heat treatment of the substrate in the method of this invention, the following advantages can be obtained.

1. Since the influence of the shrinkage of glass substrate can be alleviated, the temperature of heat treatment can be set higher, thereby making it possible to lower the resistance of the source/drain region of the thin film transistor and hence to realize a high speed operation of the device.

2. Since the threshold voltage of the thin film transistor can be lowered, a driving with low voltages can be realized.

3. Since the shrinkage of glass substrate can be suppressed, the deviation of pattern in the alignment of pattern can be suppressed so that a fine lay-out can be easily realized.

4. Since the cooling time can be shortened due to the increased cooling rate, the treating time as a whole including heat treatment can be shortened, whereby making it possible to enhance the through-put.

Due to these advantages, it is possible according to this invention to form a TFT of excellent property at the pixel portion with fine lay-out. It is also possible according to this invention to realize an image display of high quality such as an increased brightness that is resulted from an increase of opening ratio of the pixel portion.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalent.

I claim:

1. A method of manufacturing an array substrate of a liquid crystal display device where said array substrate comprises a glass substrate and a thin film transistor formed on said glass substrate, said method comprising the steps of:

forming a semiconductor layer on said glass substrate;

implanting an impurity into said semiconductor layer;

heat-treating said glass substrate with said semiconductor layer at a temperature ranging from (Ts−200° C.) to Ts, wherein Ts is a strain point of glass constituting the glass substrate, after the step of implanting an impurity; and quenching said glass substrate by a quenching means which is capable of promoting cooling of said glass substrate and controlling cooling rate of said glass substrate.

2. The method according to claim 1, which further comprises the steps of forming a gate insulating film on said semiconductor layer and forming a gate electrode on said gate insulating film in prior to the step of implanting an impurity; and the steps of forming an interlayer insulating film, forming a contact hole passing through said interlayer insulating film and through said gate insulating film, and forming a source electrode and a drain electrode each being connected with the impurity implantation region of said semiconductor layer in subsequent to the step of implanting the impurity.

3. The method according to claim 1, which further comprises the steps of forming a gate electrode on said glass substrate and forming a gate insulating film so as to cover said gate electrode in prior to the step of forming a semiconductor layer; and a step of forming a source electrode and a drain electrode each being connected with the impurity implantation region of said semiconductor layer in subsequent to the step of implanting the impurity.

4. A method of manufacturing an array substrate of a liquid crystal display device where said array substrate comprises a glass substrate and a thin film transistor formed on said glass substrate, said method comprising the steps of:

forming a gate electrode and a semiconductor layer over said glass substrate;

forming a gate insulating film between said gate electrode and said semiconductor layer;

heat-treating said glass substrate with said gate insulating film at a temperature ranging from (Ts−200° C.) to Ts, wherein Ts is a strain point of glass constituting the glass substrate, after the step of forming said gate insulating film; and quenching said glass substrate by a quenching means which is capable of promoting cooling of said glass substrate and controlling cooling rate of said glass substrate.

5. The method according to claim 4, which further comprises the steps of forming a gate insulating film on said semiconductor layer and forming a gate electrode on said gate insulating film in prior to the step of implanting an impurity; and the steps of forming an interlayer insulating film, and forming a contact hole passing through said interlayer insulating film and through said gate insulating film in subsequent to the step of implanting the impurity, said step of heat-treating the glass substrate being performed in subsequent to the step of forming the gate insulating film.

6. The method according to claim 4, wherein said gate insulating film comprises silicon oxide as a main component.

7. The method according to claim 4, which further comprises the steps of forming a gate electrode on said glass substrate and forming a gate insulating film so as to cover said gate electrode in prior to the step of forming a semiconductor layer; and a step of forming a source electrode and a drain electrode each being connected with the impurity implantation region of said semiconductor layer in subsequent to the step of implanting the impurity, said step of heat-treating the glass substrate being performed in subsequent to the step of forming the gate insulating film.

8. The method according to claim 4, wherein said gate insulating film comprises silicon oxide as a main component.

9. A method of manufacturing an array substrate of a liquid crystal display device where said array substrate comprises a glass substrate and a thin film transistor formed on said glass substrate, said method comprising the steps of:

forming an amorphous silicon layer containing hydrogen on said glass substrate;

heat-treating said glass substrate with said amorphous silicon layer at a temperature ranging from (Ts−200° C.) to Ts, wherein Ts is a strain point of glass constituting the glass substrate, so as to reduce the content of hydrogen in said amorphous silicon layer;

quenching said glass substrate by a quenching means which is capable of promoting cooling of said glass substrate and controlling cooling rate of said glass substrate; and converting said amorphous silicon layer into a polycrystalline layer by applying an irradiating energy beam onto said amorphous silicon layer, after the step of heat-treatment.

10. A method of manufacturing an array substrate of a liquid crystal display device where said array substrate comprises a glass substrate and a thin film transistor formed on said glass substrate, said method comprising the steps of:

forming an amorphous silicon layer on said glass substrate;

heat-treating said glass substrate with said amorphous silicon layer at a temperature ranging from (Ts–200° C.) to Ts, wherein Ts is a strain point of glass constituting the glass substrate, so as to convert said amorphous silicon layer into a polycrystalline layer; and quenching said glass substrate by a quenching means which is capable of promoting cooling of said substrate and controlling cooling rate of said glass substrate.

* * * * *